(12) United States Patent
Houng et al.

(10) Patent No.: US 11,177,150 B2
(45) Date of Patent: Nov. 16, 2021

(54) CLUSTER TOOL AND METHOD USING THE SAME

(71) Applicant: TAIWAN SEMICONDUCTOR MANUFACTURING CO., LTD., Hsinchu (TW)

(72) Inventors: Wei-Hua Houng, Hsinchu (TW); Che-Fu Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 286 days.

(21) Appl. No.: 16/353,959

(22) Filed: Mar. 14, 2019

(65) Prior Publication Data

US 2020/0294834 A1    Sep. 17, 2020

(51) Int. Cl.
*B24C 1/00* (2006.01)
*H01L 21/677* (2006.01)
*H01L 21/687* (2006.01)
*H01L 21/67* (2006.01)

(52) U.S. Cl.
CPC ........ *H01L 21/67778* (2013.01); *B24C 1/003* (2013.01); *H01L 21/6719* (2013.01); *H01L 21/6773* (2013.01); *H01L 21/67167* (2013.01); *H01L 21/67196* (2013.01); *H01L 21/67201* (2013.01); *H01L 21/67748* (2013.01); *H01L 21/67772* (2013.01); *H01L 21/68707* (2013.01)

(58) Field of Classification Search
CPC combination set(s) only.
See application file for complete search history.

(56) References Cited

U.S. PATENT DOCUMENTS

| | | | |
|---|---|---|---|
| 8,292,698 B1 * | 10/2012 | Shih | H01L 21/67028 451/39 |
| 2001/0027030 A1 * | 10/2001 | Vasudev | H01L 21/67028 438/784 |
| 2014/0227882 A1 * | 8/2014 | Inai | H01L 21/67051 438/712 |

* cited by examiner

*Primary Examiner* — Erin F Bergner
(74) *Attorney, Agent, or Firm* — Maschoff Brennan

(57) ABSTRACT

A method includes transferring a wafer into a first process chamber of a cluster tool; performing a first process to the wafer in the first process chamber; transferring the wafer from the first process chamber to a second process chamber of the cluster tool after performing the first process; cleaning the first process chamber; performing a second process to the wafer in the second process chamber during cleaning the first process chamber.

20 Claims, 15 Drawing Sheets

CLUSTER TOOL AND METHOD USING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
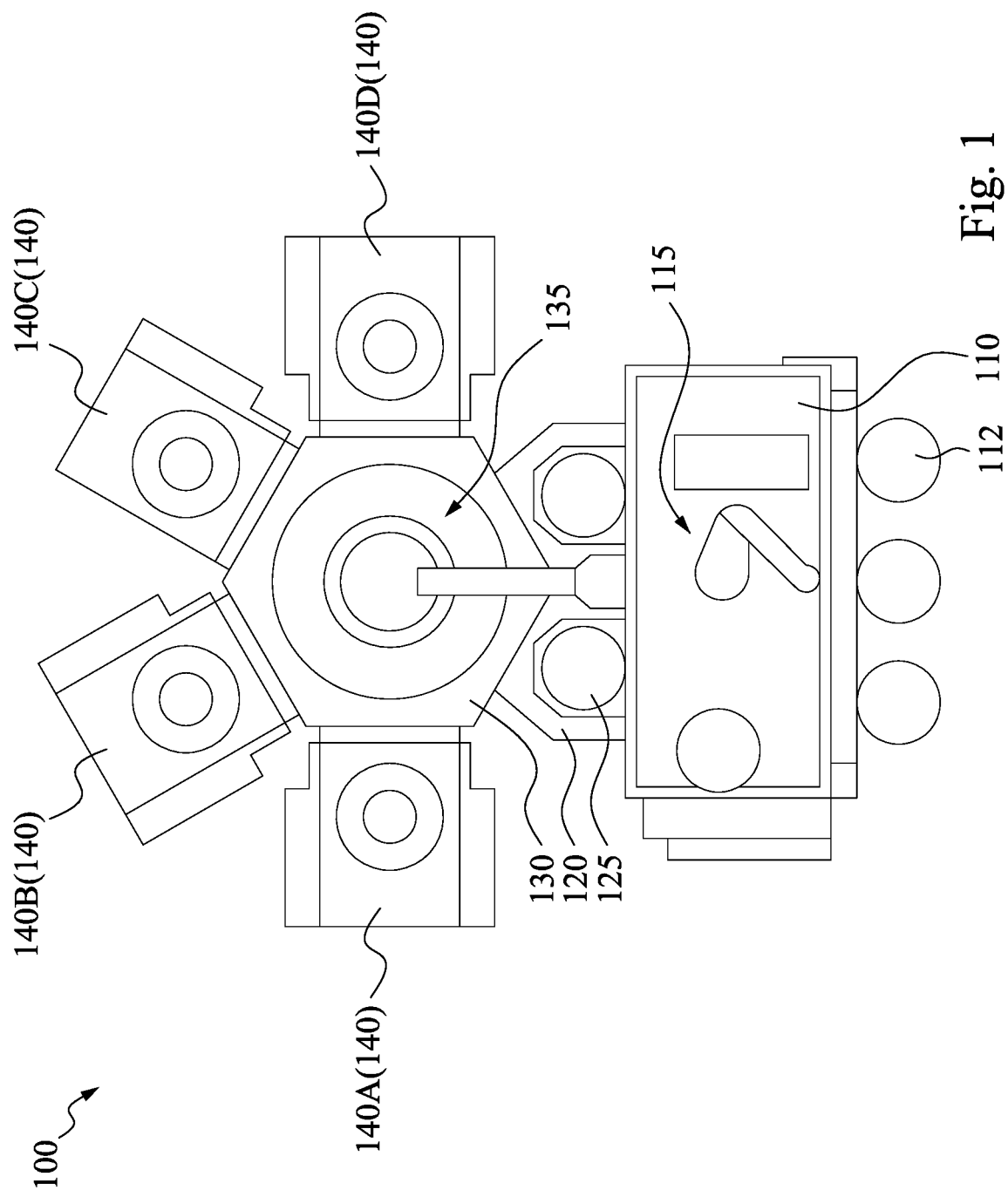
FIG. 1 is a top view of a cluster tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
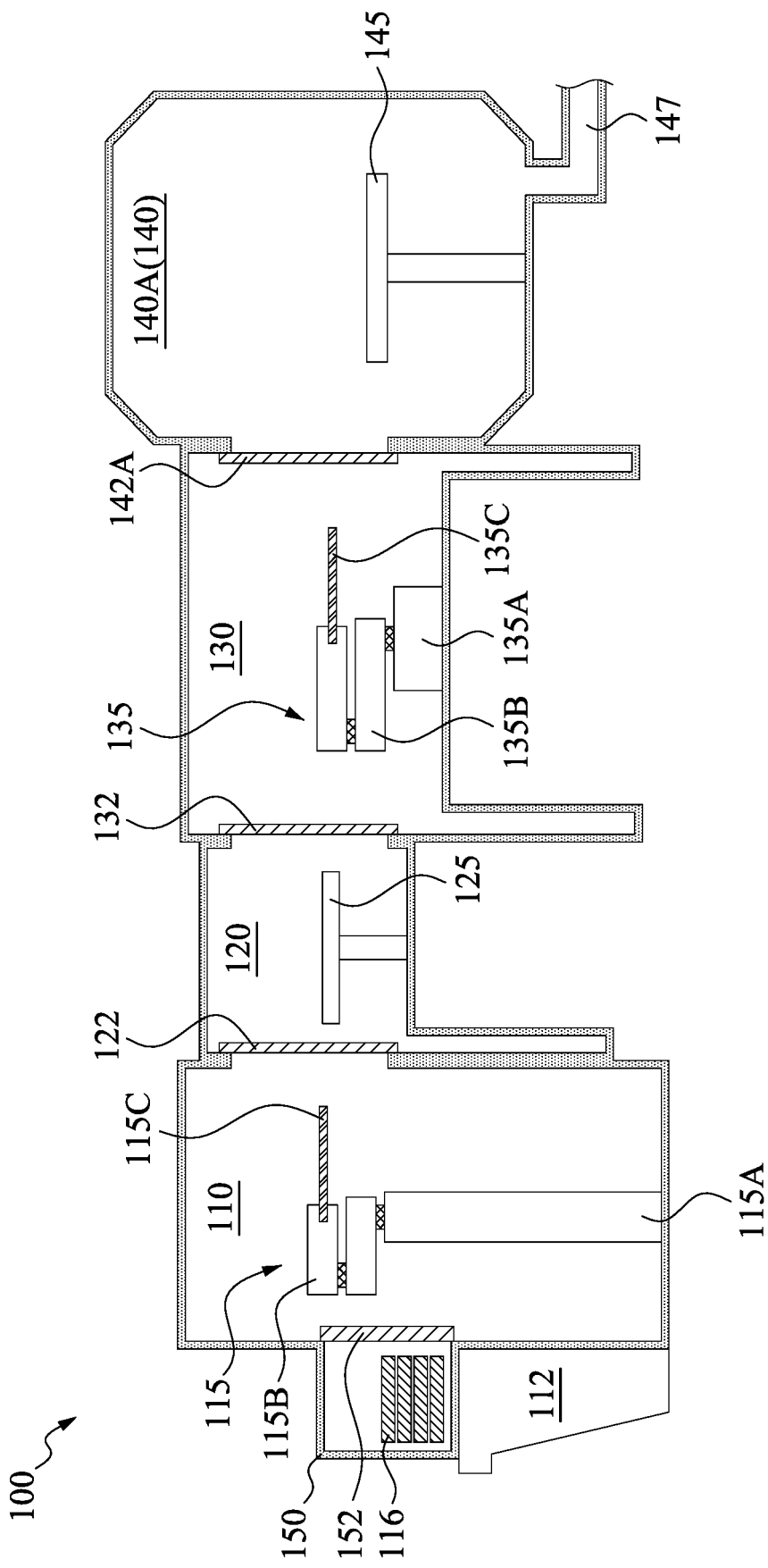
FIG. 2 is a cross-sectional view of a cluster tool in accordance with some embodiments of the present disclosure.
Figure 4:
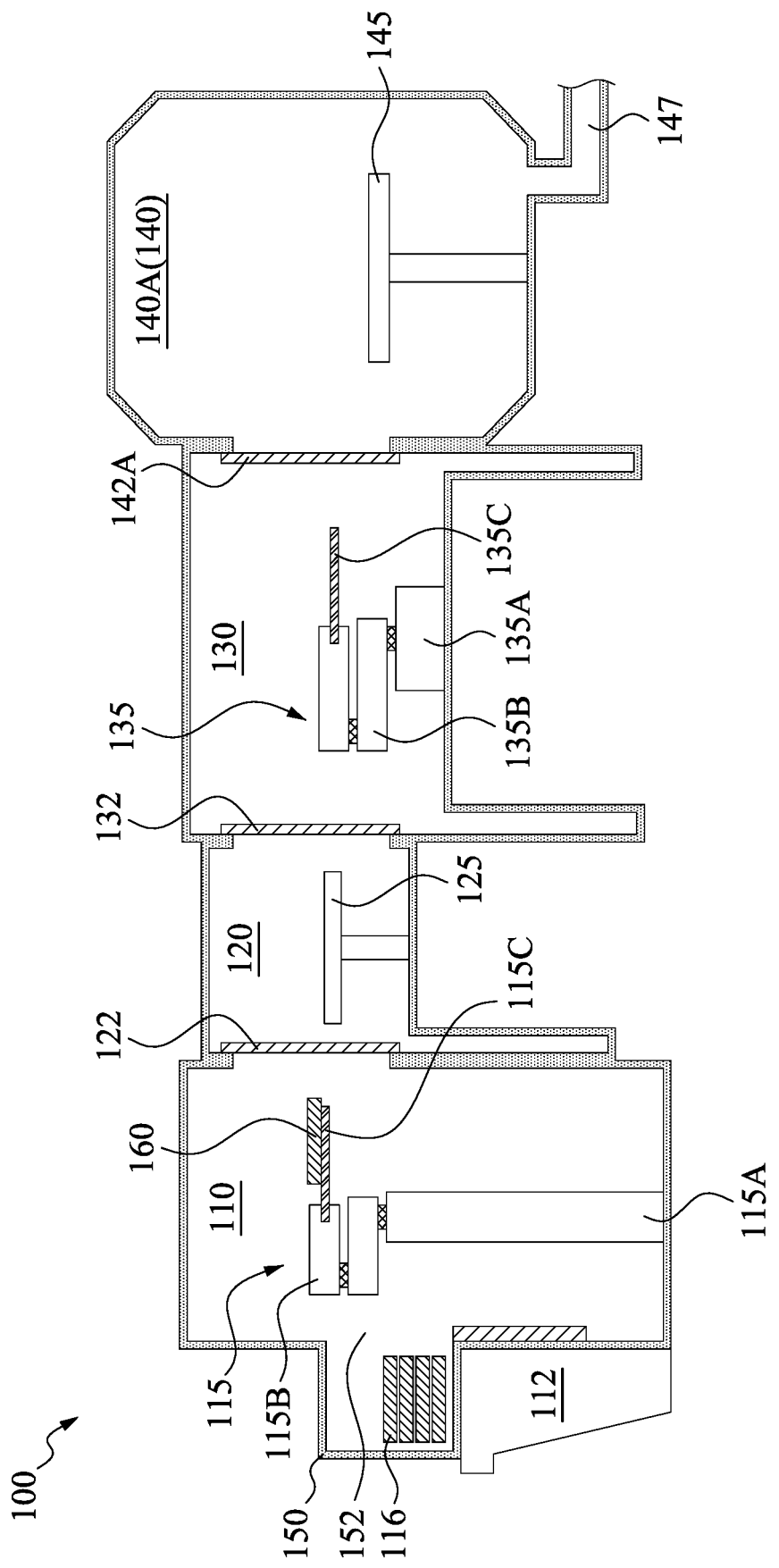

Reference is made to FIGS. 1 and 2. FIG. 1 is a top plan view of a cluster tool 100, and FIG. 2 shows a schematic cross-sectional side view of the same. In some embodiments, the cluster tool 100 includes a central transfer chamber 130 with a central transfer robot arm 135, one or more process chambers 140, one or more load lock chambers 120, an equipment front end module (EFEM) 110 with a load lock transfer robot arm 115, and one or more load ports 112. The central transfer chamber 130 connects to the process chambers 140 and to the load lock chambers 120. This configuration allows the central transfer robot arm 130 to transport a wafer (e.g., the wafer 160 as shown in FIG. 4) between the process chambers 140 and the load lock chambers 120. In some embodiments, the process chambers 140 include process chambers 140A-140D, the number of the process chambers 140 are merely used to explain, less or more process chambers 140 may also be employed in some other embodiments.

In some embodiments, the wafer 160 may be a substrate. The wafer 160 may include one or more semiconductor, conductor, and/or insulator layers. The semiconductor layers may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the wafer 160 may include layered semiconductors. Examples include the layering of a semiconductor layer on an insulator such as that used to produce a silicon-on-insulator ("SOI") substrate, a silicon-on-sapphire substrate, or a silicon-germanium-on-insulator substrate, or the layering of a semiconductor on glass to produce a thin film transistor ("TFT").

The area of the cluster tool 100 defined by the central transfer chamber 130 and the process chambers 140 is sealed. Atmospheric controls, including filtering, provide an environment with extremely low levels of particulates and airborne molecular contamination ("AMC"), both of which may damage the wafer 160. By creating a microenvironment within the cluster tool 100, the process chambers 140 can be operated in a cleaner environment than the surrounding facilities. This allows tighter control of contaminates during wafer processing at reduced cost.

The load lock chamber 120 preserves the atmosphere within the central transfer chamber 130 and process chambers 140 by separating them from the EFEM 110. The load lock chamber 120 includes two doors, a central transfer chamber door 132 and a load lock door 122. The wafer 160 is inserted into the load lock chamber 120 and both doors are sealed. The load lock chamber 120 is capable of creating an atmosphere compatible with the EFEM 110 or the central transfer chamber 130 depending on where the loaded wafer 160 is scheduled to be next. This may involve altering the gas content of the load lock chamber 120 by such mechanisms as adding purified gases or creating a vacuum, along with other suitable means for adjusting the load lock chamber atmosphere. When the correct atmosphere has been reached, the corresponding door may be opened, and the wafer 160 can be accessed.

The EFEM 110 provides a closed environment to transfer the wafer 160 into and out of the cluster tool 100. The EFEM 110 contains the load lock robot arm 115 which performs the physical transfer of the wafer 160. The wafer 160 is loaded through the load port 112. In some embodiments, the wafer 160 arrives at the load port 112 contained in a transport carrier 150 such as a front-opening unified pod ("FOUP"), a front-opening shipping box ("FOSB"), a standard mechanical interface ("SMIF") pod, and/or other suitable container. The transport carrier 150 is a magazine for holding one or more wafers 160 and for transporting wafers 160 between manufacturing tools. In some embodiments, the transport carrier 150 may have features such as coupling locations and electronic tags to facilitate use with an automated materials handling system (AMHS). The transport carrier 150 is sealed in order to provide a microenvironment for the wafer 160 contained within and to protect the wafer 160 and the cluster tool 100 against contamination. To prevent loss of the controlled atmosphere, the transport carrier 150 may have a door 152 such that the transport carrier 150 remains sealed until it is docked with the load port 112.

Figure 3:
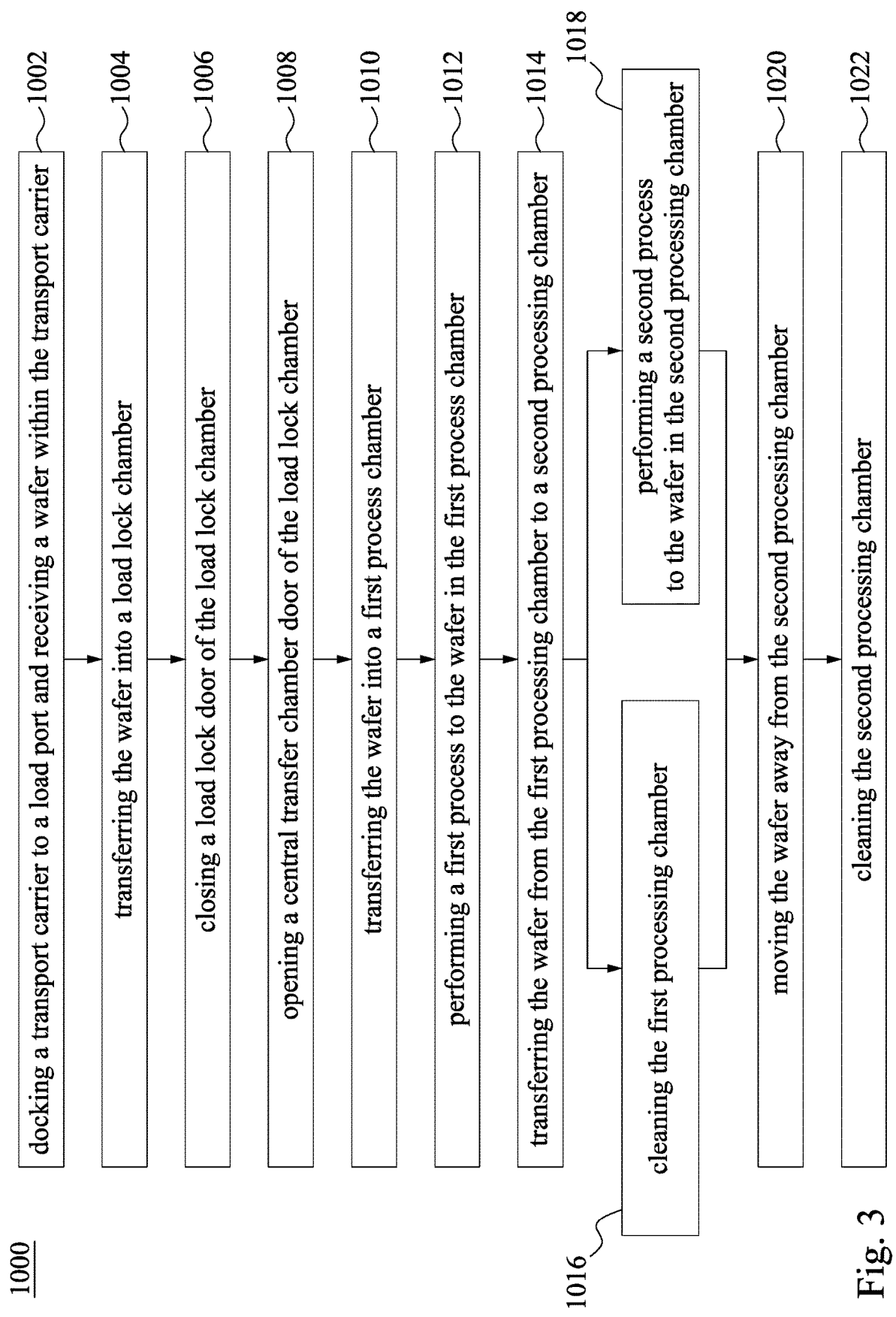
FIGS. 3 to 13B illustrate a method for operating a wafer processing tool at various stages in accordance with some embodiments of the present disclosure.

FIG. 3 is a method for using the cluster tool in accordance with some embodiments of the present disclosure.

Reference is made to FIGS. 1, 3 and 4. The method 1000 begins at operation 1002 by docking a transport carrier to a load port and receiving a wafer within the transport carrier. In FIG. 4, at the beginning, the transport carrier 150 is docked to the load port 112. Then, the door 152 of the transport carrier 150 is opened, and the load lock transfer robot arm 115 within the EFEM 110 clamp the wafer 160 disposed in the transport carrier 150, and then moves the wafer 160 into the EFEM 110.

In some embodiments, the load lock transfer robot arm 115 includes a support 115A. An armset 115B is mounted on the support 115A. In some other embodiments, the armset 115B includes suitable number of arms, such as two or more. The arms of the armset 115B are rotatably connected to each other. At the far end of the armset 115B, an end effector 115C is rotatably connected thereto. The load lock transfer robot arm 115 can position the end effector 115C in a desired position within a circle around the support 115A, having a radius that is substantially determined by the length of the armset 115B. As is apparent, also other kinds of robot arm may be used. The end effector 115C is arranged to clamp an object, such as the wafer 160 shown in FIG. 4. For example, the end effector 115C clamps the wafer 160 in the transport carrier 150, and then moves the wafer 160 into the EFEM 110.

Figure 5:
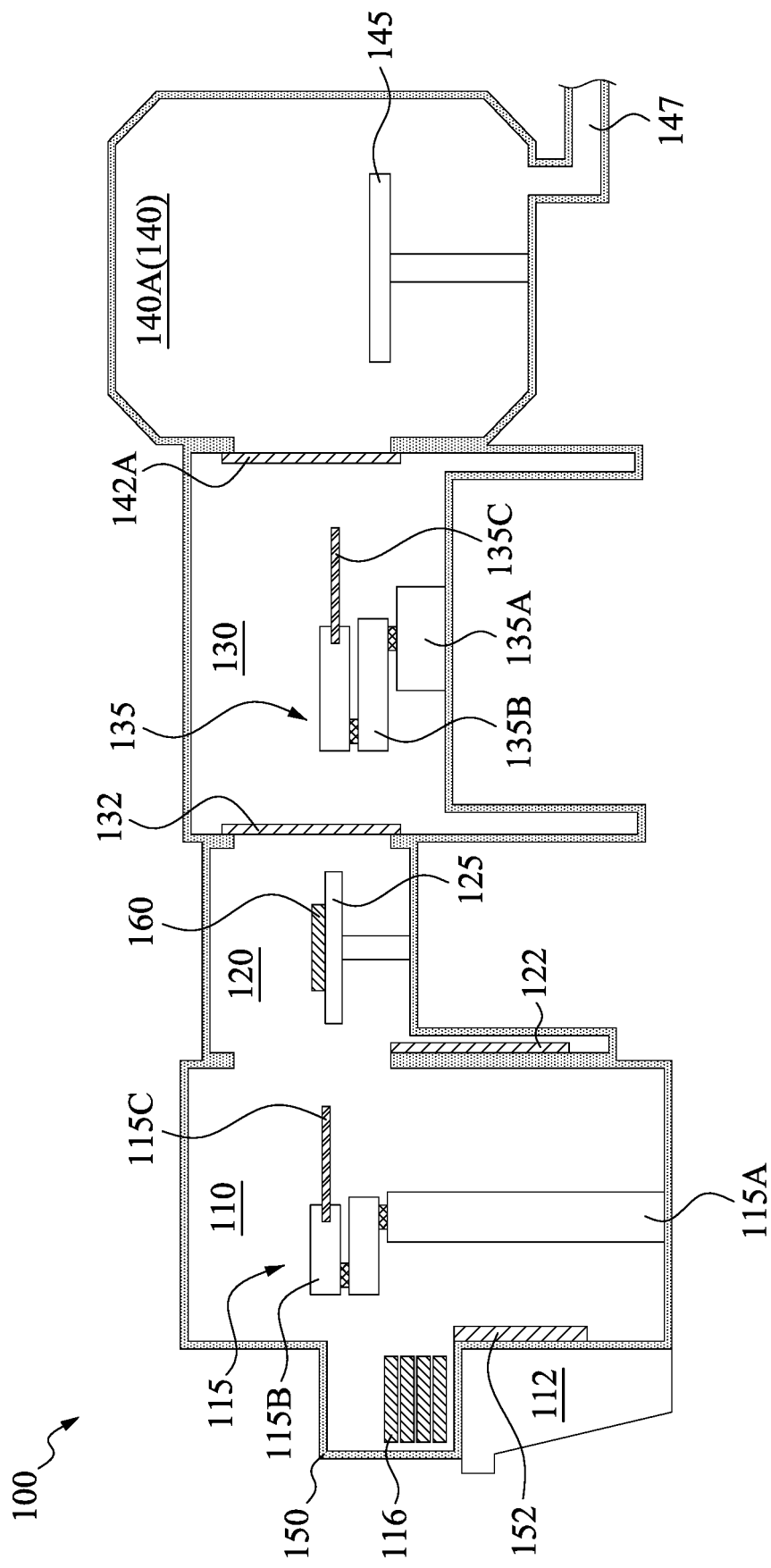

Reference is made to FIGS. 1, 3 and 5. The method 1000 proceeds to operation 1004 by transferring the wafer into a load lock chamber. In FIG. 5, the wafer 160 is transferred from the EFEM 110 to the load lock chamber 120 by the load lock transfer robot arm 115. While the wafer 160 is about to be transferred, the load lock door 122 is opened, and the load lock transfer robot arm 115 moves the wafer 160 into the load lock chamber 120 and places the wafer 160 on a supporter 125. Once the wafer 160 is placed on the supporter 125 of the load lock chamber 120, the load lock transfer robot arm 115 releases the wafer 160 and moves back to the EFEM 110.

Figure 6:
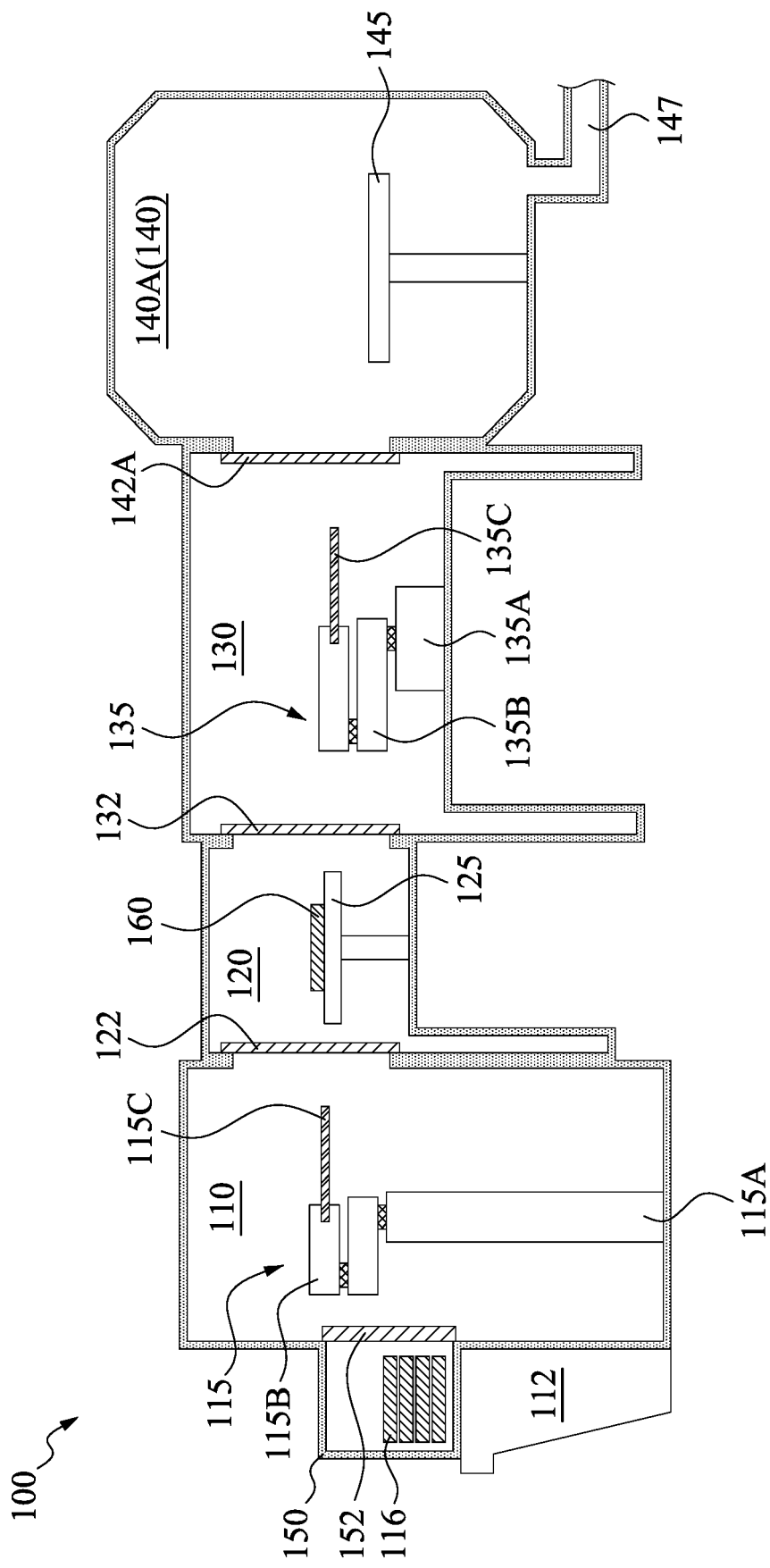

Reference is made to FIGS. 1, 3 and 6. The method 1000 proceeds to operation 1006 by closing a load lock door of the load lock chamber. In FIG. 6, the load lock door 122 is closed, so as to seal the load lock chamber 120. In the fabrication of a semiconductor device, many wafer processes are performed in the process chambers 140A under vacuum or near-vacuum pressure. The load lock chamber 120 operates as a buffer area where pressure on the wafer 160 is adjusted. After the wafer 160 is transferred into the load lock chamber 120 from the EFEM 110, the load lock chamber 120 changes the atmospheric pressure to a value of pressure maintained in the central transfer chamber 130. In some embodiments, the value of pressure maintained in the central transfer chamber 130 is much lower than the atmospheric pressure or almost near vacuum as designated by some wafer processes. The pressure in the load lock chamber 120 is adjusted via a gas pump (not shown) attached thereto. In some embodiments, an inflow of nitrogen (N2) gas is generated by the gas pump, and is used to control the pressure inside the load lock chamber 120.

The load lock chamber 120 is connected to the central transfer chamber 130 via the central transfer chamber door 132. In some embodiments, during controlling the pressure inside the load lock chamber 120, the load lock door 122 and the central transfer chamber door 132 are closed to separate (i.e., gaseously isolate) the load lock chamber 120 from the EFEM 110 and the central transfer chamber 130, to seal the load lock chamber 120 and maintain the pressure therein. Stated another way, the load lock chamber 120 is gaseously isolated from the EFEM 110 and the central transfer chamber 130 during controlling the pressure inside the load lock chamber 120.

Figure 7:
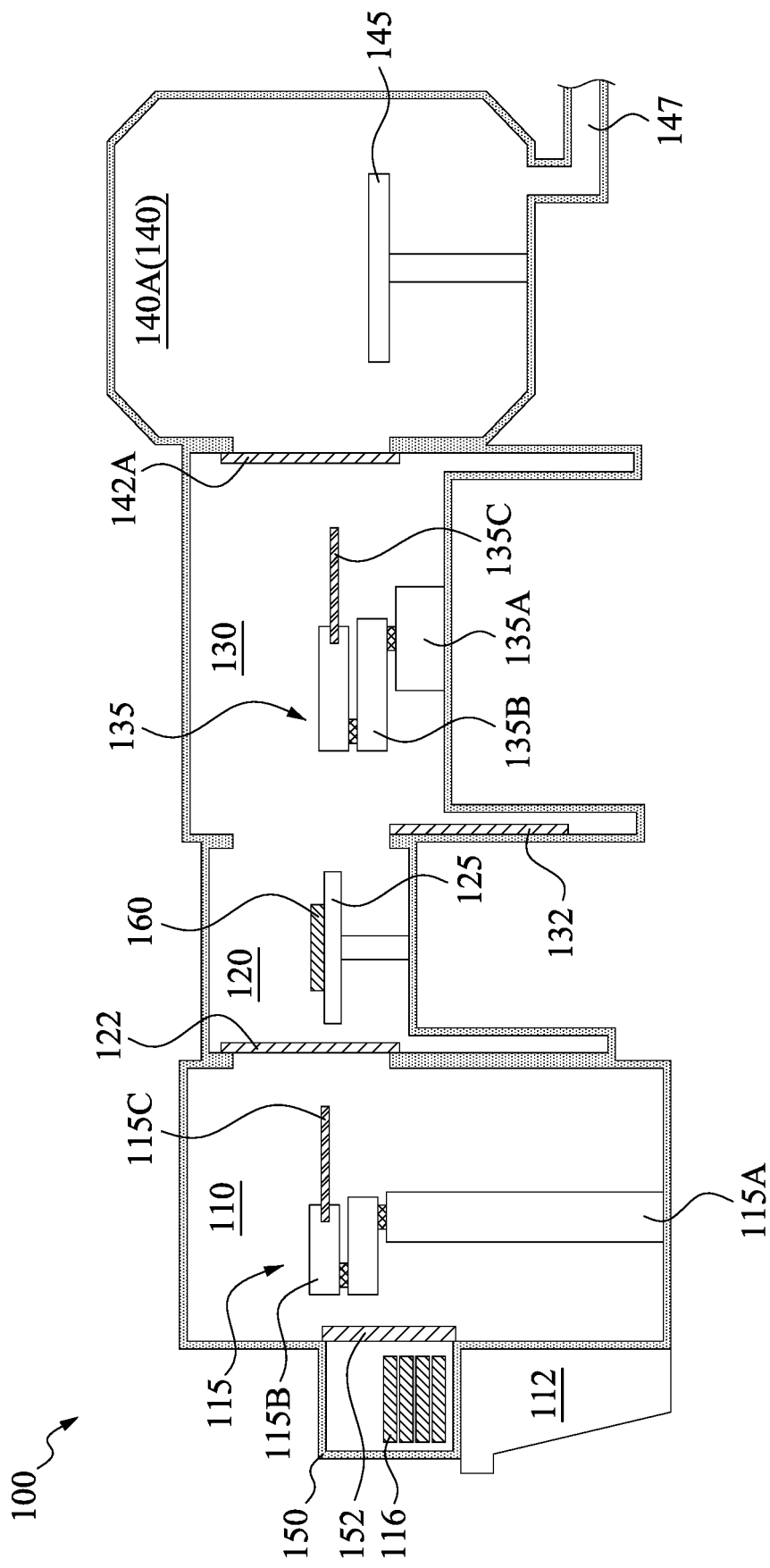

Reference is made to FIGS. 1, 3 and 7. The method 1000 proceeds to operation 1008 by opening a central transfer chamber door of the load lock chamber. In FIG. 7, the central transfer chamber door 132 is opened, and thus the load lock chamber 120 and the central transfer chamber 130 are spatially communicated to (i.e., in gaseous communication) each other. In some embodiments, opening the central transfer chamber door 132 results in a pressure and temperature equilibrium between the load lock chamber 120 and the central transfer chamber 130, through gaseous communication therebetween. Accordingly, the central transfer chamber door 132 is opened after the pressure in the load lock chamber 120 is adjusted to become equal to that of the central transfer chamber 130.

Figure 8:
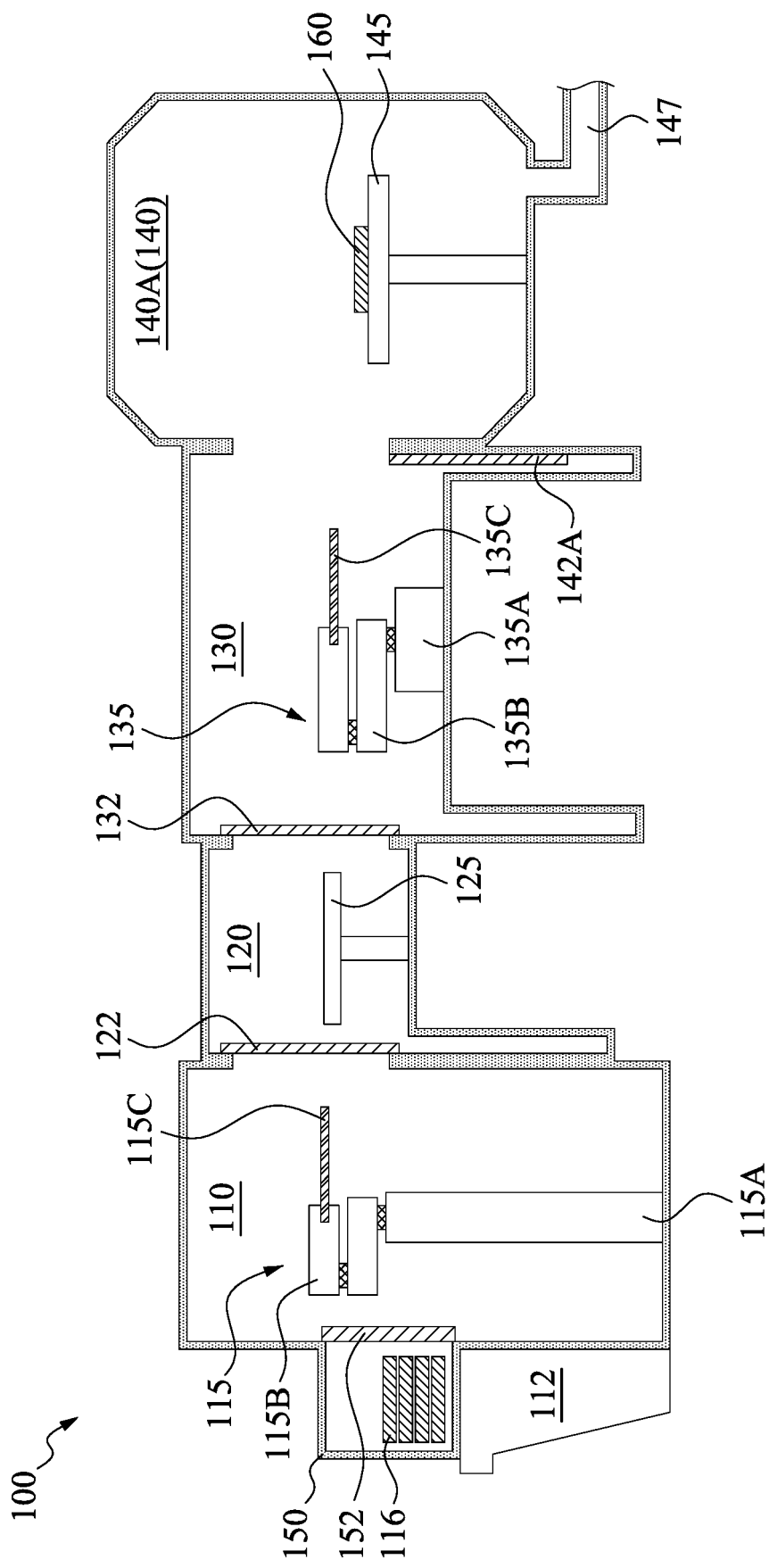

Reference is made to FIGS. 1, 3 and 8. The method 1000 proceeds to operation 1010 by transferring the wafer into a first process chamber. In FIG. 8, the wafer 160 is transferred from the load lock chamber 120 to the process chamber 140A by the central transfer robot arm 135 within the central transfer chamber 130. In greater detail, the central transfer robot arm 135 grasps the wafer 160 on the supporter 125 within the load lock chamber 120 and then moves the wafer 160 from the load lock chamber 120 into the process chamber 140. In some embodiments, the robot arm 135 places the wafer 160 on a chuck 145 in the process chamber 140, such that the bottom surface of the wafer 160 is in contact with the top surface of the chuck 145. As an example, the wafer 160 is transferred into the process chambers 140A of the process chambers 140A shown in FIG. 1, and thus the process chamber 140A in FIG. 8 is also referred to as process chamber 140A. In some other embodiments, the wafer 160 can also be moved into the process chambers 140B-D in FIG. 1.

In some embodiments, the central transfer chamber 130 plays the role of a central dock station where the wafer 160 transferred from the load lock chamber 120 are temporarily kept in preparation for processing and distributed to the plurality of process chambers 140A by the central transfer robot arm 135. In some embodiments, the central transfer chamber 130 is held under vacuum (e.g., at a pressure of less than 10-2 mbar). That is, the gas environment inside the central transfer chamber 130 has a lower atmosphere pressure than the gas environment outside the central transfer chamber 130 (or the cluster tool 100). In some embodiments, at an entrance to the process chamber 140A, there is a chamber door 142A.

In some embodiments, the central transfer robot arm 135 includes a support 135A. An armset 135B is mounted on the support 135A. In some other embodiments, the armset 135B may include suitable number of arms, such as two or more. The arms of the armset 135B are rotatably connected to each other. At the far end of the armset 135B, an end effector 135C is rotatably connected to an end of the armset 135B. The load lock transfer robot arm 135 can position the end effector 135C in a desired position within a circle around the support 135A, having a radius that is substantially associated with the length of the armset 135B. As is apparent, also other kinds of robots may be used. The end effector 135C is arranged to grasp an object, such as the wafer 160. For example, the end effector 135C grasps the wafer 160 in the load lock chamber 120 and then moves the wafer 160 into the process chamber 140A.

Figure 9:
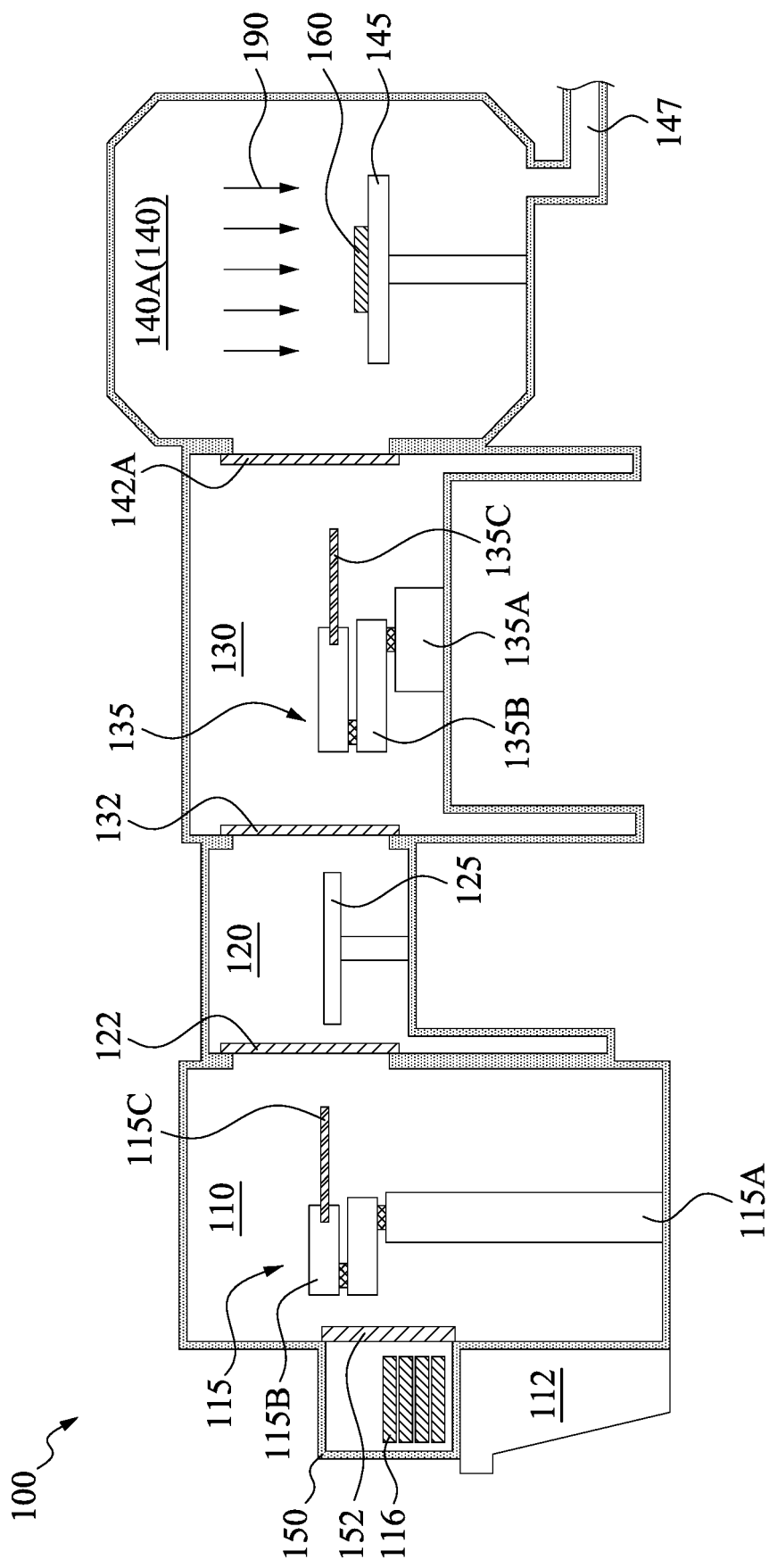

Reference is made to FIGS. 1, 3 and 9. The method 1000 proceeds to operation 1012 by performing a first process to the wafer in the first process chamber. In FIG. 9, once the wafer 160 is transferred into the process chamber 140A, the chamber door 142A is closed. Then, a process 190 is performed to the wafer 160. In some embodiments, the process chamber 140A may be configured to perform suitable manufacturing process on the wafer 160. The process 190 include deposition processes such as physical vapor deposition ("PVD"), chemical vapor deposition ("CVD"), plasma-enhanced chemical vapor deposition ("PECVD"), electrochemical deposition ("ECD"), molecular beam epitaxy ("MBE"), atomic layer deposition ("ALD") and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the wafer 160; and/or any combination of procedures.

Figure 10A:
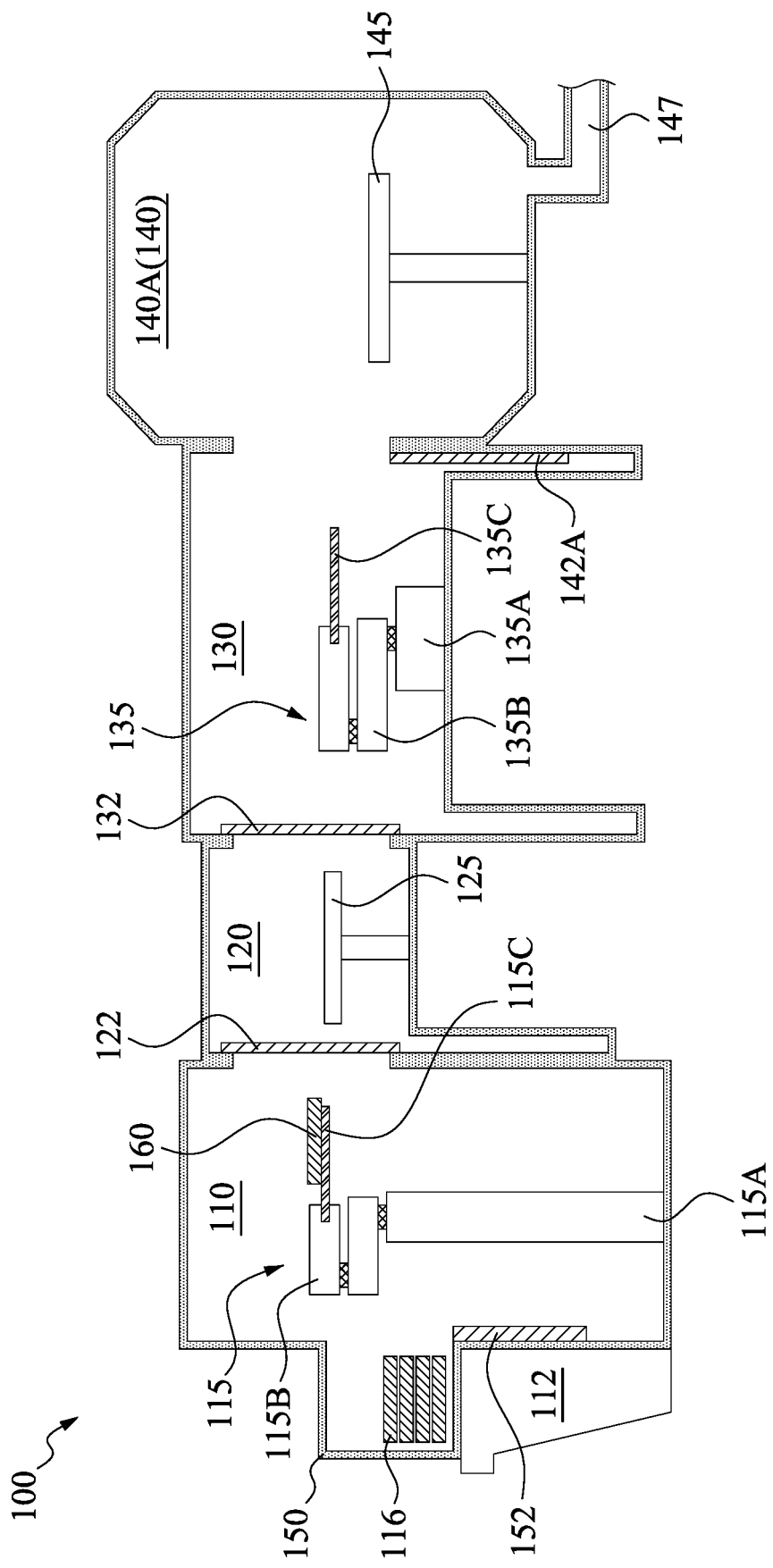
Figure 10B:
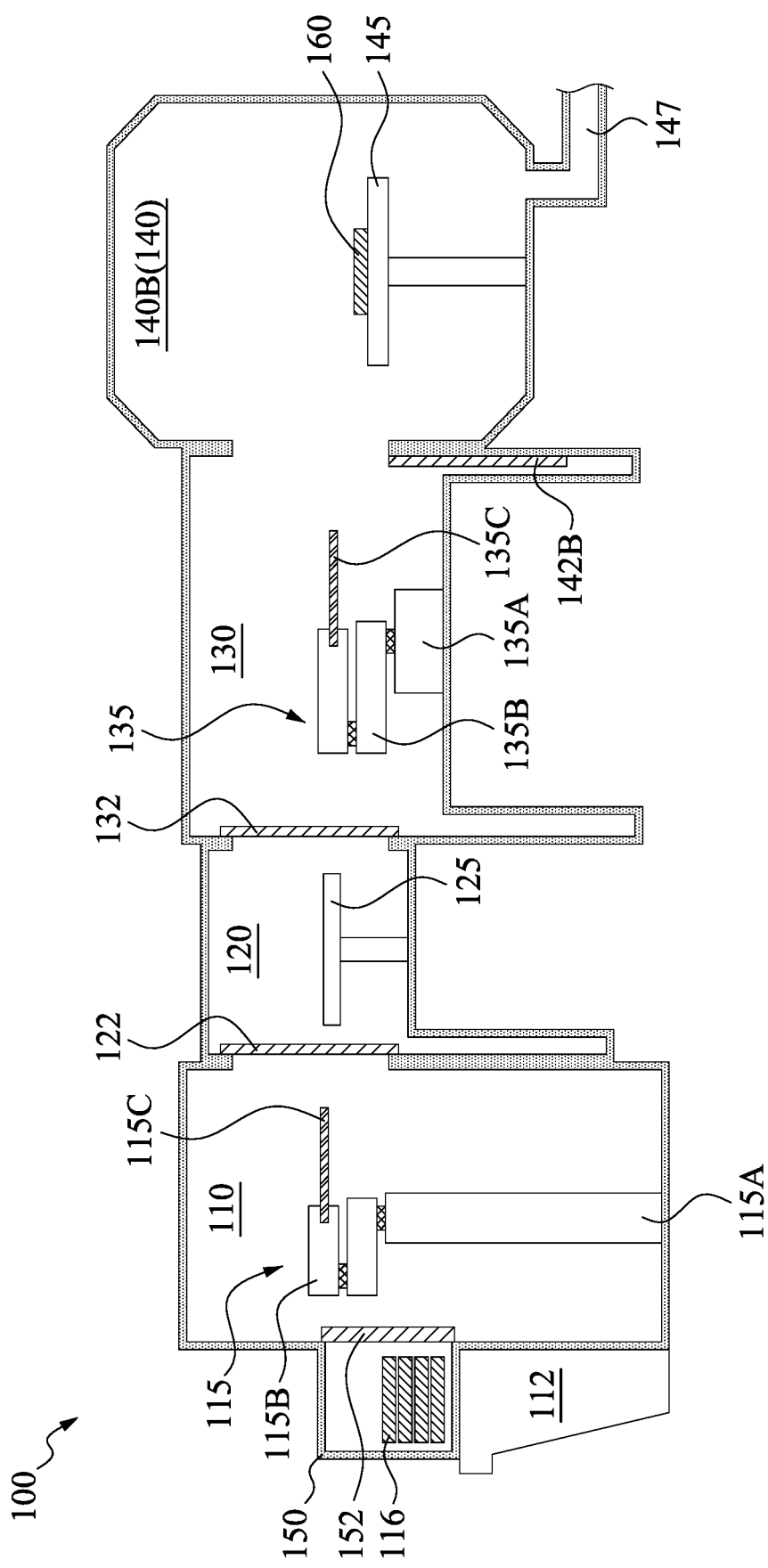

Reference is made to FIGS. 1, 3, 10A and 10B. The method 1000 proceeds to operation 1014 by transferring the wafer from the first process chamber to a second process chamber. FIGS. 10A and 10B are cross-sectional view of process chamber 140A and 104B, respectively. In FIG. 10A, the wafer 160 is moved away from the process chamber 140A, and thus the process chamber 140A is empty. That is, the first process chamber 140A is free of the wafer 160 after the wafer 160 is moved away. On the other hand, as shown in FIG. 10B, the wafer 160 is transferred to the process chamber 140B and is placed on the chuck 145 in the process chamber 140B. In greater detail, after the process performed in the process chamber 140A is finished, the chamber door 142A of the process chamber 140A is opened, and the central transfer robot arm 135 within the central transfer chamber 130 moves into the process chamber 140A to grasp the wafer 160. Then, another chamber door 142B of the process chamber 140B is opened, and the central transfer robot arm 135 then moves the wafer 160 from the process chamber 140A to the second process chamber 140B and places the wafer 160 on the chuck 145 in the process chamber 140B. The wafer 160 is transferred from the process chamber 140A (FIG. 10A) to the process chamber (FIG. 10B) by the central transfer robot arm 135 within the central transfer chamber 130 to perform another process to the wafer 160. In some embodiments, the second process chamber 140B may be similar to or different from the process chamber 140A. For example, the process chambers 140A and 140B may be used to perform the same or different processes.

Figure 11:
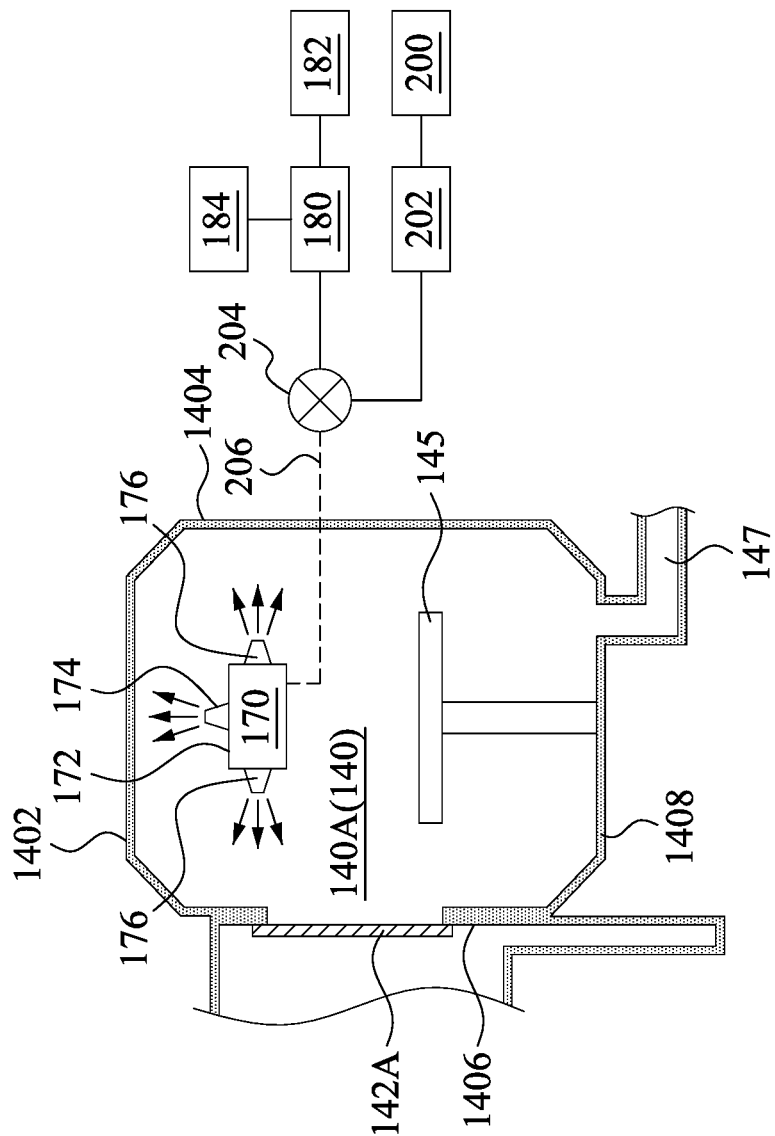

Reference is made to FIGS. 1, 3 and 11. The method 1000 proceeds to operation 1016 by cleaning the first process chamber and operation 1018 by performing a second process to the wafer in the second process chamber. FIG. 11 is an enlarged view of the process chamber 140A of FIG. 10A. In FIG. 11, the process chamber 140A includes a cleaning module 170 disposed therein. The process chamber 140A includes a ceiling 1402, a plurality of inner sidewalls 1404 and 1406, and a floor 1408, which collectively form an accommodation space of the process chamber 140A. Because the process 190 in FIG. 9 may result in residue or contamination on the inner surfaces of the process chamber 140A (e.g., the ceiling 1402, the inner sidewalls 1404 and 1406 and the floor 1408), a cleaning process is performed to clean the process chamber 140A, so as to remove the residue or contamination from the inner surfaces of the process chamber 140A. During the cleaning process, the chamber door 142A is kept closed, so as to seal the process chamber 140A.

In some embodiments, the cleaning module 170 includes a body 172, and nozzles 174 and 176 disposed thereon. In FIG. 11, the nozzle 174 is disposed on a top surface of the body 172, and nozzles 176 are disposed on sidewalls of the body 172. The number of nozzles 174 and 176 are merely illustrative, less or more nozzles 174 and 176 may also be employed in some other embodiments. In some other embodiments, the cleaning module 170 may include two or more bodies 172, and the nozzles 174 and 176 are disposed respectively on the bodies 172.

The cleaning module 170 is connected to a cleaning material source 182 via a pelletizer 180, a control valve 204, and an ejection line 206. In some embodiments, the cleaning material is a carbon dioxide ($CO_2$) gas source. For example, the cleaning material source 182 may be a carbon dioxide gas cylinder, which stores carbon dioxide in gas phase. The pelletizer 180 is connected to the carbon dioxide gas cylinder 182, so as to receive the carbon dioxide gas from the carbon dioxide gas cylinder and thereby compressing the carbon dioxide gas to form solid carbon dioxide pellets therein. The pelletizer 180 is connected to the nozzles 174 and 176 of the cleaning module 170 by, for example, the ejection line 206. In some embodiments, a pneumatic pump 184 is connected with the pelletizer 180 to push the solid carbon dioxide pellets from the pelletizer 180 into the ejection line 206. In this way, the solid carbon dioxide pellets in the pelletizer 180 are pneumatically pushed to the nozzles 174 and 176 through the ejection line 206, and therefore these solid carbon dioxide pellets are then pneumatically ejected out of the nozzles 174 and 176. The control valve 204 is disposed between the pelletizer 180 and the ejection line 206, so as to control the flow rate of the solid carbon dioxide pellets and/or to enable or disable the pellets flow and/or gas flow from the pelletizer 180 to the ejection line 206.

The control valve 204 is connected to a controller 202 and a signal generator 200. In some embodiments, the signal generator 200 is configured to generate a cleaning trigger signal in response to closing the chamber door 142A. In other words, once the chamber door 142A is closed, the signal generator 200 generates a cleaning trigger signal. Then, the cleaning trigger signal is transmitted to the valve controller 202, and once the controller 202 received the cleaning trigger signal, the controller 202 turns on the control valve 204 so as to allow solid carbon dioxide pellets to be pneumatically pushed out of the nozzles 174 and 176 through the ejection line 206, thus performing the cleaning process on the ceiling 1402 and the inner sidewalls 1404 and

1406. In some embodiments, the controller 202 and the signal generator 200 may be computer, or the like.

On the other hand, the controller 202 turns off the control valve 204 when the process chamber 204 is not under the cleaning process, so as to prevent the solid carbon dioxide pellets from being ejected into the process chamber 140A. For example, the cleaning process is finished by turn off the control valve 204 to stop ejecting the solid carbon dioxide pellets into the process chamber 140A. In some embodiments, the control valve 204 is off during the process 190 described in FIG. 9. In some other embodiments, the cleaning process is kept off before closing the chamber door 142A, and then is opened to start the cleaning process after closing the chamber door 142A. In some embodiments, the control valve 204 is kept off while the top surface of the chuck 145 is free of wafer (e.g., wafer 160). That is, the top surface of the chuck 145 is free of wafer during the cleaning process.

In some embodiments, the cleaning process may also be referred to as carbon dioxide blasting process by using solid carbon dioxide pellets. Carbon dioxide ($CO_2$) "dry ice" pellet technology uses compressed air generated from the pneumatic pump 184 to accelerate frozen "dry ice" pellets to a high velocity, and thus, deliver via a nozzle (e.g., nozzles 174 and 176) arrangement a high velocity stream of non-toxic, non-hazardous, non-explosive, dense carbon dioxide pellets. The solid carbon dioxide pellets are shot against surfaces to be cleaned (e.g., ceiling 1402, the inner sidewalls 1404 and 1406, and the floor 1408). Upon impact, the dry ice pellets sublimate to a harmless gaseous state (vaporize), and upon removal of the contaminants, the surface is left clean, dry and undamaged.

The cleaning process is performed to clean the inner surfaces of the process chamber 140A (e.g., ceiling 1402, the inner sidewalls 1404 and 1406, and the floor 1408). For example, the nozzle 174 is directed to (i.e., aimed at) the ceiling 1402 of the process chamber 140A, so as to eject the solid carbon dioxide pellets toward the ceiling 1402, and thereby cleaning the ceiling 1402 of the process chamber 140A. On the other hand, the nozzles 176 on the sidewalls of the body 172 of the cleaning module 170 are directed to (i.e., aimed at) the sidewalls 1404 and 1406 of the process chamber 140A, and the chamber door 142A, and eject the solid carbon dioxide pellets toward them, and thereby cleaning the sidewalls 1404 and 1406 of the process chamber 140A, and the chamber door 142A by the solid carbon dioxide pellets. Stated another way, the outlets of the ejection line 206 are aimed at the inner surfaces of the process chamber 140A. In some embodiments, the exhaust port 147, which is connected to a vacuum pump, is applied to remove the dust or particles that are dislodged from the inner sidewall of the process chamber 140A.

As mentioned before with respect to FIGS. 10A and 10B, the wafer 160 is transferred to the chamber 140B before performing the cleaning process in the process chamber 140A. In some embodiments, during the cleaning process performed in the process chamber 140A, another process may be performed to the wafer 160 in the process chamber140B. That is operations 1016 and 1018 may be performed at the same time in some embodiments. The process performed in the process chamber140B may be similar to or different from the process 190 discussed in FIG. 9. Thus, the cleaning process discussed in FIG. 11 can also be referred to as a "real-time" cleaning process, because when a cleaning process is performed in a process chamber (e.g., the process chamber140A), the wafer (e.g., the wafer 160) is still under processing in another process chamber (e.g., the process chamber 140B). Stated another way, a cleaning process is performed in one process chamber without halting or stopping processes performed in other chambers.

In some embodiments, the cleaning process performed in the process chamber 140A can also be referred to as an in-situ cleaning process. In some embodiments, the cleaning process performed "in-situ" indicates that no vacuum-break occurs between the operations 1014 and 1020, or during the operations 1016 and 1018. In some embodiments, the cleaning process performed "in-situ" indicates that the gas environment in the process chamber 140A is not exposed to an atmosphere external to the cluster tool 100 during the cleaning process. Also, the EFEM 110, the load lock chamber 120, and the central transfer chamber 130 are not exposed to the atmosphere external to the cluster tool 100 during the cleaning process.

According to aforementioned embodiments, a cleaning process is in-situ performed to self-clean the process chamber once a process is finished therein. The cleaning process is performed without opening the cluster tool. That is, the gas environment in the cluster tool is not exposed to an atmosphere external to the cluster tool. Therefore, the cleaning process can be performed without halting or stopping processes performed in other chambers, which in turn will save time and further reduce periodic maintenance (PM) manpower and extends Mean Time Between Cleans (MTBC).

Figure 12B:
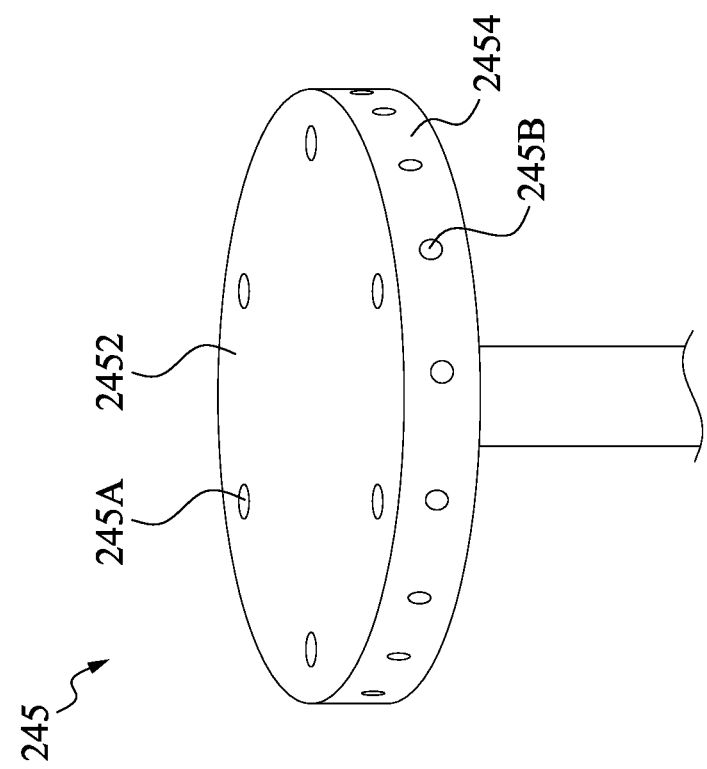
Figure 12A:
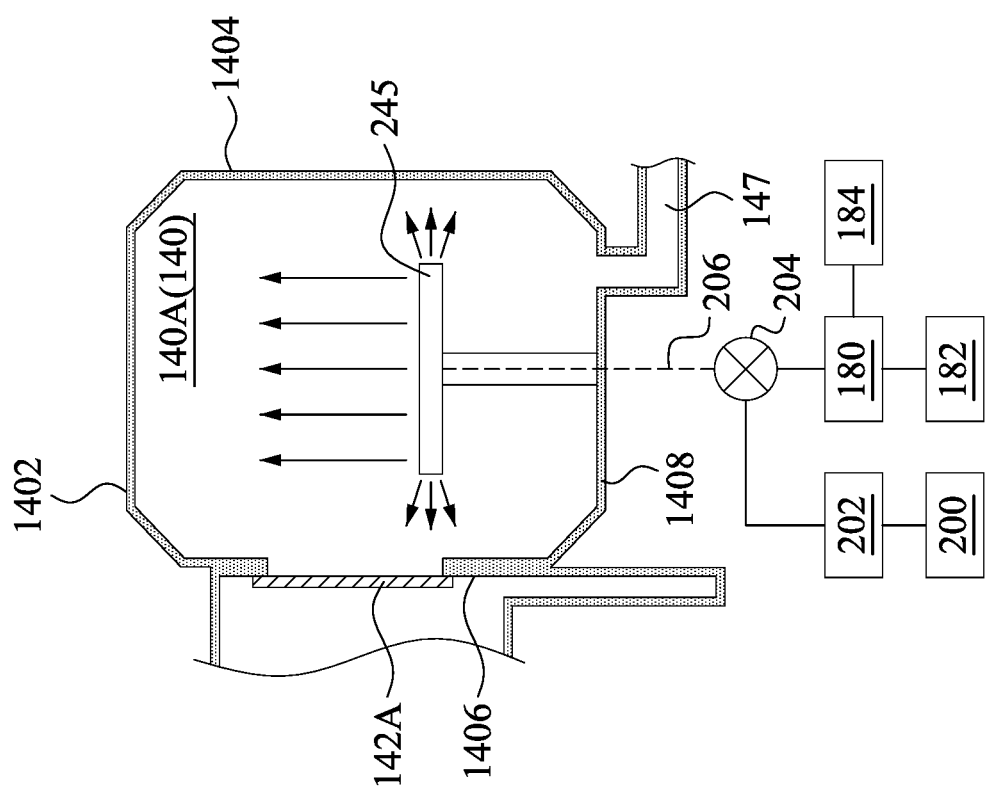

Reference is made to FIGS. 12A and 12B, in which FIG. 12B is a perspective view of a chuck 245 of FIG. 12A. FIGS. 12A and 12B illustrate some other embodiments of operation 1016. Different from those described in FIG. 11, the cleaning process of FIG. 12A is performed to clean the inner surfaces of the process chamber 140A (e.g., the ceiling 1402, the inner sidewalls 1404 and 1406 and the floor 1408) by using the chuck 245 as a cleaning module. That is, the ejection line 206 is disposed in the chuck 245, and the outlets of the ejection line 206 are aimed at inner surfaces of the process chamber 140A. In some embodiments, the cleaning process is performed by pneumatically ejecting carbon dioxide pellets from the chuck 245. The cleaning process is similar to those described in FIG. 11, and thus relevant details in this regard will not be repeated hereinafter for the sake of brevity. During the cleaning process, the chamber 242 is closed. The cleaning process in FIG. 12A is in-situ performed.

In FIG. 12B, the chuck 245 includes a top surface 2452 and a sidewall 2454. The top surface 2452 is in a circular shape in some embodiments. In some embodiments, the top surface 2452 of the chuck 245 includes a plurality of openings 245A, and the sidewall 2454 of the chuck 245 includes a plurality of openings 245B, respectively. In some embodiments, the openings 245A and 245B are at outlets of the ejection line 206, so as to eject the solid carbon dioxide pellets. In some embodiments, the openings 245A are directed toward the ceiling 1402 of the process chamber 140A, and the openings 245B are directed toward the sidewalls 1404 and 1406, and the chamber door 142A. Stated another way, the openings 245A and 245B are directed respectively toward directions that are substantially perpendicular to each other. It is noted that, since the chuck 245 is used to receive the wafer 160 discussed in FIGS. 8 and 9, and thus the wafer 160 may be in contact with the top surface 2452 and covers parts of the openings 245A on the chuck 245 during operations 1010 and 1012 discussed in FIGS. 8 and 9. Stated another way, the cleaning module described in FIGS. 12A and 12B are integrated in the chuck 245 of the process chamber 140A, which in turn will reduce space in the process chamber 140A.

On the other hand, the controller 202 turns off the control valve 204 when the process chamber 204 is not under the cleaning process, so as to prevent the solid carbon dioxide pellets from being ejected into the process chamber 140A. For example, the cleaning process is finished by turn off the control valve 204 to stop ejecting the solid carbon dioxide pellets into the process chamber 140A. In some embodiments, the control valve 204 is off during the process 190 described in FIG. 9. In some other embodiments, the cleaning process is kept off before closing the chamber door 142A, and then is opened to start the cleaning process after closing the chamber door 142A. In some embodiments, the control valve 204 is kept off while the top surface of the chuck 145 is free of wafer (e.g., wafer 160). That is, the top surface of the chuck 145 is free of wafer during the cleaning process.

Figure 13A:
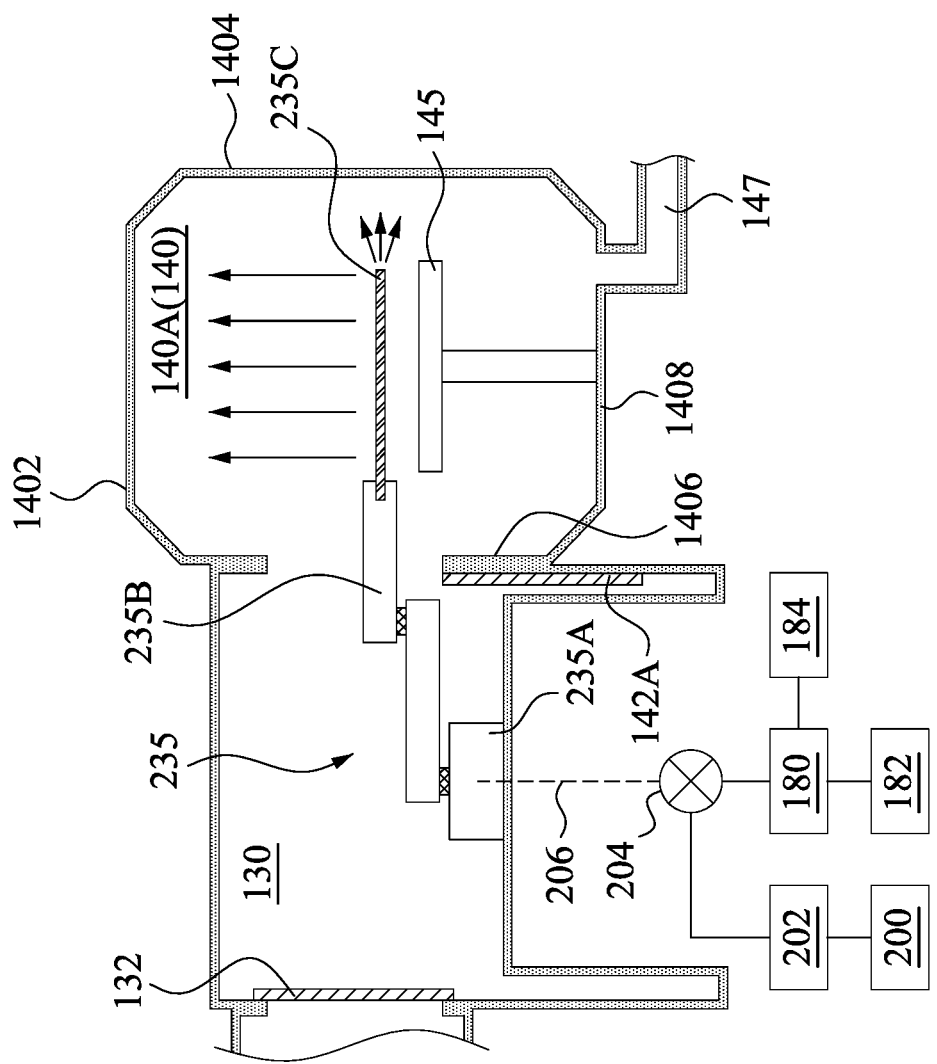
Figure 13B:
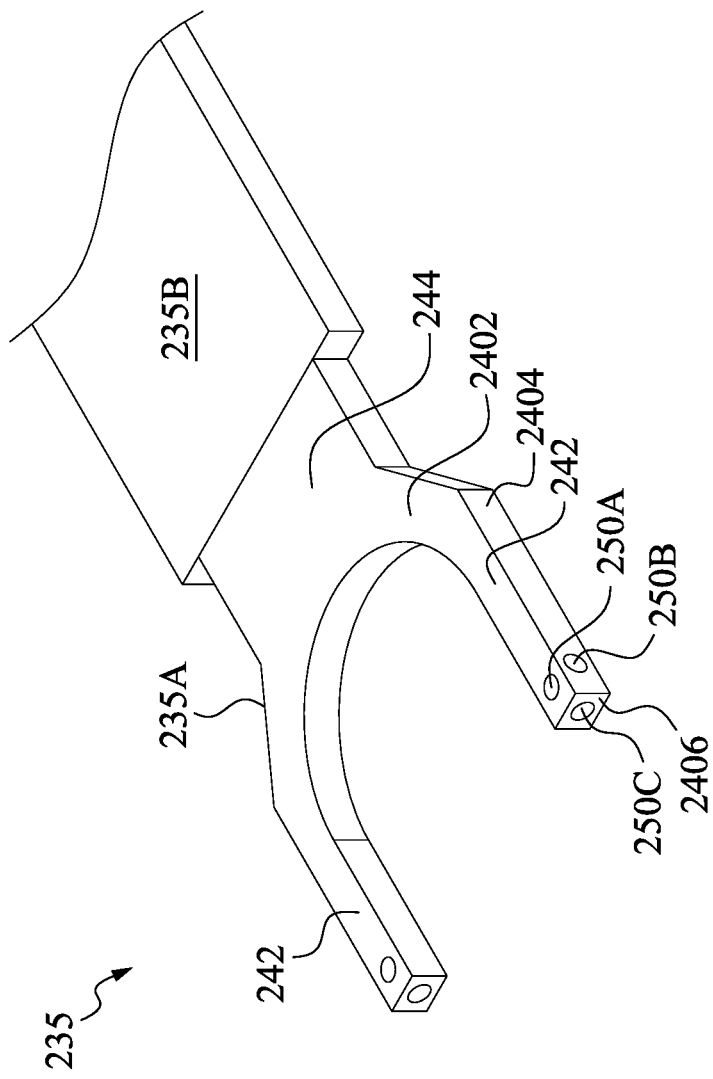

Reference is made to FIGS. 13A and 13B, in which FIG. 13B is a perspective view of a central transfer robot arm 235 of FIG. 13A. FIGS. 13A and 13B illustrate some other embodiments of operation 1016. Different from those described in FIG. 11, the cleaning process of FIG. 13A is performed to clean the inner surfaces of the process chamber 140A (e.g., the ceiling 1402, the inner sidewalls 1404 and 1406 and the floor 1408) by using the central transfer robot arm 235 as a cleaning module. That is, the ejection line 206 is disposed in the central transfer robot arm 235. The cleaning process is similar to those described in FIG. 11, and thus relevant details in this regard will not be repeated hereinafter. During the cleaning process, the chamber 242 is opened, such that the central transfer robot arm 235 can move into the process chamber 140A to clean the process chamber 140A by pneumatically ejecting solid carbon dioxide pellets. The outlets of the ejection line 206 are aimed at inner surfaces of the process chamber 140A.

It is noted that, in some embodiments, the signal generator 200 is configured to generate a cleaning trigger signal in response to closing the chamber door 142B of the second process chamber 140B of FIG. 10B. Then, the cleaning trigger signal is transmitted to the controller 202, and once the controller 202 received the cleaning trigger signal, the controller 202 turns on the control valve 204 so as to perform the cleaning process on the first process chamber 140A. In this way, the second process chamber 140B is free from the solid carbon dioxide pellets ejected into the first process chamber 140A, because the chamber door 142A gaseously isolates the second process chamber 140B from the first process chamber 140A.

The central transfer robot arm 235 is similar to the central robot arm 135 described above. For example, the central transfer robot arm 235 may include a support 235A, an armset 235B, and an end effector 235C. In greater detail, the end effector 235C includes a base portion 244 connected to the armset 235B, and the end effector 235C further includes a plurality of tip portions 242 connected to the base portion 244 and extend away from the base portion 244. The end effector 235C is configured to grasp the wafer (e.g., the wafer 160 described in FIGS. 2-11) during transferring the wafer. In some embodiments where the central transfer robot arm 235 serves as a cleaning module, the end effector 235C includes a plurality of openings 250A, 250B, and 250C disposed thereon. In greater detail, the openings 250A are disposed on the top surface 2402 of the end effector 235C, the openings 250B are disposed on the sidewall 2404 of the end effector 235C, and the openings 250C are disposed on the sidewall 2406 of the end effector 235C distal (furthest) from the armset 235B. In some embodiments, the openings 250A to 250C are connected to the cleaning material source 182 and the pelletizer 180, and are configured to eject the cleaning material, such as solid carbon dioxide pellets.

Because the chamber door 142A of the first process chamber 140A is opened during the cleaning process, the process chamber 140A and the central transfer chamber 130 are in gaseous communication during the cleaning process discussed in FIGS. 13A and 13B. In some embodiments, the cleaning process is still "in-situ" performed, because the gas environment in the process chamber 140A and central transfer chamber 130 is not exposed to an atmosphere external to the cluster tool 100 during the cleaning process. In some embodiments, the process chamber 140A and central transfer chamber 130 are maintained under substantially the same pressure during the cleaning process. Also, the EFEM 110 and the load lock chamber 120 are not exposed to the atmosphere external to the cluster tool 100 during the cleaning process. Because the cleaning process is performed with the chamber door 142 of the process chamber 140A opened, chamber doors of other process chambers that are under processing (e.g., the chamber door 142B of the process chamber 140B discussed in FIG. 10B) are closed, so as to gaseously isolated from the process chamber 140A and the central transfer chamber 130 to prevent from contamination.

On the other hand, the controller 202 turns off the control valve 204 when the process chamber 204 is not under the cleaning process, so as to prevent the solid carbon dioxide pellets from being ejected into the process chamber 140A. For example, the cleaning process is finished by turn off the control valve 204 to stop ejecting the solid carbon dioxide pellets into the process chamber 140A. In some embodiments, the control valve 204 is off during the process 190 described in FIG. 9. In some other embodiments, the control valve 204 is kept off before the central transfer robot arm 235 moves into the process chamber 140A, and then is opened to start the cleaning process after the central transfer robot arm 235 moves into the process chamber 140A. Also, as described in FIG. 8, when the central transfer robot arm 235 moves the substrate 160 into the process chamber 140A, the control valve 204 is kept off.

Reference is made to FIG. 3. The method 1000 proceeds to operation 1020 by moving the wafer away from the second process chamber. As discussed in operation 1018, a process is performed to the wafer 160 in the process chamber 140B (see FIG. 10B) during the cleaning process of operation 1016. Once the process performed in the process chamber 140B is finished, the wafer 160 may be moved away from the process chamber 140B. In some embodiments, the wafer 160 may be transferred to another process chamber, such as process chamber 140C or 140D in FIG. 1. In some other embodiments, the wafer 160 may be transferred back to the load lock chamber 120, and may be moved back to the transport carrier 150, as shown in FIGS. 1 and 2.

In some embodiments where the cleaning process is performed via embodiments shown in FIGS. 11, 12A, and 12B. The wafer 160 can be moved away from the process chamber 140B during the cleaning process performed in the process chamber 140A, because the cleaning process performed in the process chamber 140A with the chamber door closed. Thus, the central transfer robot arm 135 of the central transfer is free to move the wafer 160. Stated another way, moving the wafer 160 away from the process chamber 140B and cleaning the process chamber 140A can be performed at the same time.

In some embodiments where the cleaning process is performed via embodiments shown in FIGS. 13A and 13B. The wafer 160 is moved away from the process chamber 140B after the cleaning process performed in the process chamber 140A is finished, because the central robot arm 235 stays in the process chamber 140A during the cleaning process performed in the process chamber 140A.

Reference is made to FIG. 3. The method 1000 proceeds to operation 1022 by cleaning the second process chamber. Once the process performed in the process chamber 140B (see FIG. 10B) is finished and the wafer 160 is moved away from the process chamber 140B, a cleaning process may be performed to the process chamber 140B. The cleaning process to the process chamber 140B is similar to those described in FIGS. 11-13B, and thus relevant structural details and operation principles will not be repeated hereinafter.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a cleaning process is in-situ performed to clean a process chamber, and thus the cleaning process can be performed without halting processes performed in other chambers, which in turn will save time and further reduce periodic maintenance (PM) manpower and extends Mean Time Between Cleans (MTBC). Another advantage is that by using carbon dioxide "dry ice" pellet technology to clean the process chamber, the process chamber can be cleaned without damaging the inner surfaces thereof.

In some embodiments of the present disclosure, a method includes transferring a wafer into a first process chamber of a cluster tool; performing a first process to the wafer in the first process chamber; transferring the wafer from the first process chamber to a second process chamber of the cluster tool after performing the first process; cleaning the first process chamber; performing a second process to the wafer in the second process chamber during cleaning the first process chamber.

In some embodiments of the present disclosure, a method includes transferring a wafer into a load lock chamber of a cluster tool; transferring the wafer from the load lock chamber into a process chamber of the cluster tool by a robot arm in a central transfer chamber of a cluster tool, in which the central transfer chamber connects the load lock chamber to the process chamber; performing a process to the wafer; moving the wafer away from the process chamber; and cleaning the process chamber without exposing the process chamber to an exterior external to the cluster tool.

In some embodiments of the present disclosure, a cluster tool includes a process chamber having a chamber door, a signal generator, an ejection line, a control valve, and a controller. The signal generator is configured to generate a cleaning trigger signal in response to closing the chamber door. The ejection line has at least one outlet aimed at an inner surface of a process chamber. The control valve is in the ejection line. The controller is configured to turn on the control valve in response to the cleaning trigger signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
transferring a wafer into a first process chamber of a cluster tool by a robot arm;
performing a first process to the wafer in the first process chamber;
transferring the wafer from the first process chamber to a second process chamber of the cluster tool by the robot arm after performing the first process;
moving the robot arm into the first process chamber;
cleaning the first process chamber, wherein cleaning the first process chamber comprises ejecting a plurality of solid carbon dioxide pellets from a plurality of surfaces of the robot arm that are non-parallel; and
performing a second process to the wafer in the second process chamber during cleaning the first process chamber.

2. The method of claim 1, wherein cleaning the first process chamber further comprises ejecting a cleaning material from a nozzle of a cleaning module disposed in the first process chamber.

3. The method of claim 2, wherein the cleaning material are in solid phase.

4. The method of claim 1, wherein cleaning the first process chamber is in-situ performed.

5. The method of claim 1, further comprising moving the wafer away from the second process chamber after performing the second process and during cleaning the first process chamber.

6. The method of claim 1, wherein cleaning the first process chamber comprises directing a cleaning material to a ceiling of the first process chamber and a sidewall of the first process chamber.

7. A method, comprising:
transferring a wafer into a load lock chamber of a cluster tool;
transferring the wafer from the load lock chamber into a process chamber of the cluster tool and placing the wafer onto a chuck in the process chamber by a robot arm in a central transfer chamber of the cluster tool, wherein the central transfer chamber connects the load lock chamber to the process chamber;
performing a process to the wafer;
moving the wafer away from the process chamber; and
cleaning the process chamber by ejecting a plurality of first solid carbon dioxide pellets from a plurality of first openings on a top surface of the chuck without exposing the process chamber to an exterior external to the cluster tool.

8. The method of claim 7, wherein cleaning the process chamber comprises ejecting the plurality of first solid carbon dioxide pellets toward a ceiling.

9. The method of claim 8, further comprising:
opening a chamber door of the process chamber before moving away the wafer from the process chamber; and
closing the chamber door after moving the wafer away from the process chamber and prior to cleaning the process chamber.

10. The method of claim 7, wherein cleaning the process chamber further comprises ejecting a plurality of second solid carbon dioxide pellets from a plurality of second openings on a sidewall of the chuck.

11. The method of claim 7, wherein the placing the wafer onto the chuck is performed such that the wafer covers the first openings on the top surface of the chuck.

12. The method of claim 7, wherein a chamber door of the process chamber is closed during cleaning the process chamber.

13. A method, comprising:
performing a first process to a wafer in a first chamber;
after the first process, moving the wafer from the first chamber to a second chamber using a robot arm;
performing a second process to the wafer in the second chamber;
moving the robot arm into the first chamber; and
cleaning the first chamber by ejecting solid carbon dioxide pellets from openings on the robot arm.

14. The method of claim 13, wherein cleaning the first chamber is performed during performing the second process to the wafer in the second chamber.

15. The method of claim 13, wherein a chamber door of the first chamber is open during cleaning the first chamber.

16. The method of claim 13, further comprising moving the wafer away from the second chamber after the cleaning the first chamber.

17. The method of claim 1, wherein at least one of the plurality of surfaces includes a top surface of an end effector of the robot arm.

18. The method of claim 1, wherein at least one of the plurality of surfaces includes a first sidewall of an end effector of the robot arm.

19. The method of claim 1, wherein at least one of the plurality of surfaces includes a second sidewall of the end effector of the robot arm.

20. The method of claim 10, wherein cleaning the process chamber comprises ejecting the plurality of second solid carbon dioxide pellets toward inner sidewalls of the process chamber.

* * * * *